(12) United States Patent
Li et al.

(10) Patent No.: US 11,289,329 B2
(45) Date of Patent: Mar. 29, 2022

(54) METHODS AND APPARATUS FOR FILLING A FEATURE DISPOSED IN A SUBSTRATE

(71) Applicant: APPLIED MATERIALS, INC., Santa Clara, CA (US)

(72) Inventors: Rui Li, San Jose, CA (US); Xiangjin Xie, Fremont, CA (US); Fuhong Zhang, San Jose, CA (US); Shirish Pethe, Sunnyvale, CA (US); Adolph Allen, Oakland, CA (US); Lanlan Zhong, Santa Clara, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 48 days.

(21) Appl. No.: 16/752,630

(22) Filed: Jan. 25, 2020

(65) Prior Publication Data
US 2020/0350159 A1    Nov. 5, 2020

Related U.S. Application Data

(60) Provisional application No. 62/843,290, filed on May 3, 2019.

(51) Int. Cl.
| | |
|---|---|
| *H01L 21/02* | (2006.01) |
| *H01L 21/768* | (2006.01) |
| *C23C 14/34* | (2006.01) |
| *C23C 18/38* | (2006.01) |

(52) U.S. Cl.
CPC .... *H01L 21/02266* (2013.01); *C23C 14/3435* (2013.01); *C23C 18/38* (2013.01); *H01L 21/76841* (2013.01)

(58) Field of Classification Search
CPC ......... H01L 21/76882; H01L 23/53238; H01L 21/2266; C23C 16/0281
See application file for complete search history.

(56) References Cited

U.S. PATENT DOCUMENTS

| | | | | |
|---|---|---|---|---|
| 5,888,906 A | * | 3/1999 | Sandhu | ............ H01L 21/76814 438/706 |
| 6,144,097 A | | 11/2000 | Asahina et al. | |
| 10,269,698 B1 | * | 4/2019 | Reznicek | .......... H01L 21/76882 |
| 2001/0001298 A1 | * | 5/2001 | Cantell | ............. H01L 21/28518 438/683 |

(Continued)

OTHER PUBLICATIONS

International Search Report for PCT/US2020/030191, dated Aug. 13, 2020.

*Primary Examiner* — John A Bodnar
(74) *Attorney, Agent, or Firm* — Moser Taboada

(57) ABSTRACT

Methods and apparatus for method for filling a feature with copper. In some embodiments, the methods include: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces the mobility of copper compared to the mobility of copper over the second cobalt portion.

20 Claims, 6 Drawing Sheets

(56) References Cited

U.S. PATENT DOCUMENTS

| | | |
|---|---|---|
| 2009/0248952 A1 | 10/2009 | Ishizaka et al. |
| 2011/0298062 A1 | 12/2011 | Ganguli et al. |
| 2011/0306200 A1 | 12/2011 | Lee et al. |
| 2015/0203961 A1 | 7/2015 | Ha et al. |
| 2015/0299886 A1 | 10/2015 | Doubina et al. |
| 2017/0084487 A1* | 3/2017 | Chebiam .......... H01L 21/76883 |
| 2019/0115254 A1 | 4/2019 | Sheu et al. |
| 2020/0294911 A1* | 9/2020 | Amanapu ......... H01L 23/53252 |

* cited by examiner

METHODS AND APPARATUS FOR FILLING A FEATURE DISPOSED IN A SUBSTRATE

CROSS-REFERENCE TO RELATED APPLICATIONS

This application claims benefit of U.S. provisional patent application Ser. No. 62/843,290 filed on May 3, 2019, which is herein incorporated by reference in its entirety.

FIELD

Embodiments of the present disclosure generally relate to methods of processing substrates, and specifically to methods for forming cobalt liners for metal interconnect structures such as copper interconnect structures.

BACKGROUND

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Interconnects provide the electrical connections between the various electronic elements of an integrated circuit and form the connections between the circuit elements and the device's external contact elements, such as pins, for connecting the integrated circuit to other circuits. Typically, interconnect lines form horizontal connections between electronic circuit elements while conductive via plugs form vertical connections between the electronic circuit elements, resulting in layered connections.

Advances in semiconductor materials and processing techniques have resulted in reducing the overall size of the integrated circuit elements while increasing their number or density on a single body. However, the inventors have observed, as device nodes get smaller (for example, approaching dimensions of about 22 nm or less), challenges present degrading electromigration lifetimes, and reducing device reliability. For example, copper is an excellent conductor and has been used in chips because copper components such as metal filled vias have excellent functionality at smaller sizes. However, copper problematically diffuses into the surroundings or along a weak interface, unless contained, for example in a liner. The inventors have observed certain liners are deficient and decrease the reliability of the interconnect device. For example, liner material may be deposited atop the field of a substrate and within a feature such as a via and detrimentally impact the flow or reflow of copper material deposited thereon. Further, the liner material may problematically promote higher copper mobility upon the field of the substrate compared to the mobility of copper on the sidewalls of a feature leading to copper end of line agglomeration or overhangs of reflowed copper material at the corners of a feature such as a high-aspect ratio via. Additionally, the inventors have observed the liner material problematically reduces or inhibits the reflow of copper into a feature, such as a via including a liner, resulting in copper overhang formation at the top corners of a feature hole and/or promoting voids or gaps formed in a copper feature plug reducing device reliability. Moreover, the inventors have observed liners may occupy too much space within a feature reducing the amount of conductive material such as copper in the feature and increasing device resistivity.

Thus, improved liners and methods for forming liners for copper interconnect structures are needed.

SUMMARY

Methods and apparatus for filling one or more features with copper are provided herein. In some embodiments, a method for filling a feature with copper includes: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion.

In some embodiments, a method of filling a copper feature on a substrate, includes: (a) sputtering cobalt from a cobalt target within a physical vapor deposition chamber to form a first cobalt layer atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion.

In some embodiments, the present disclosure relates to a non-transitory computer readable medium having instructions stored thereon, when executed, cause a method for filling a feature, comprising: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion.

In some embodiments, the present disclosure relates to a method for filling a feature with copper including: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion, and wherein the feature is filled with void-free copper.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
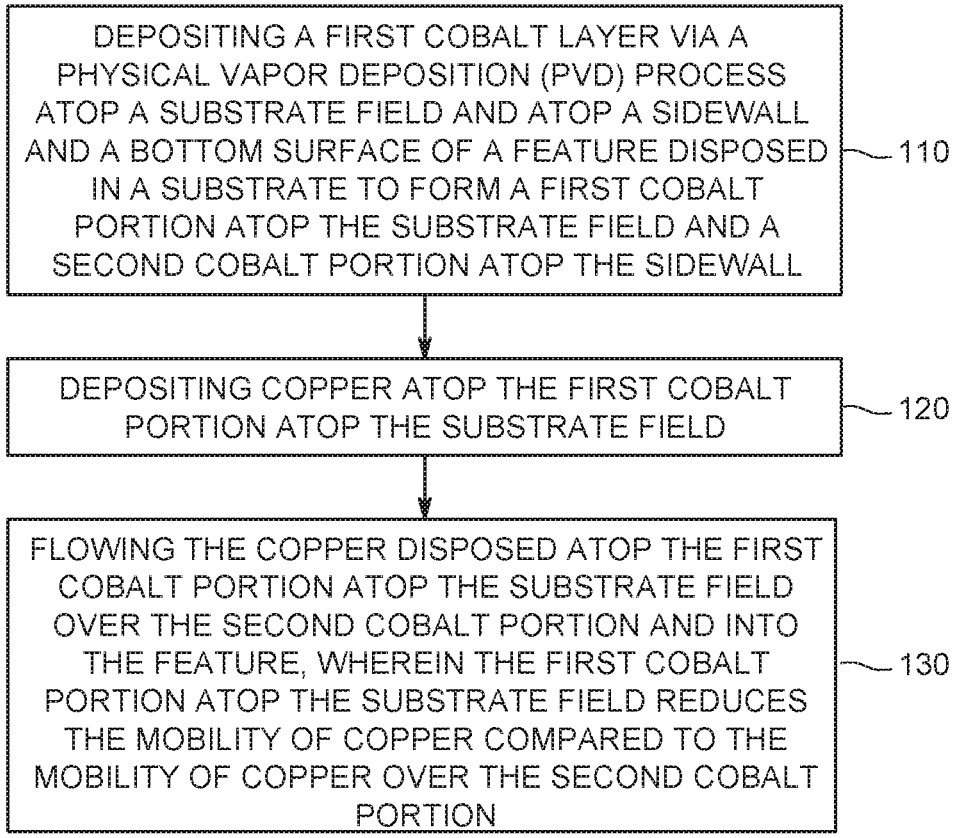
FIG. 1 is a flowchart illustrating a method of filling a feature with copper in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for selectively forming cobalt liners for copper interconnect structures are provided herein. In embodiments, a method for filling a feature with copper, includes: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion. The inventors have observed cobalt liners deposited by a physical vapor deposition (PVD) process advantageously improves copper bottom-up gap-filling of a feature, reduces the amount of liner material within a feature increasing space available for copper conductive material while lowering device resistivity, and other improved device properties. Further, the inventors have observed by using cobalt liners deposited by a physical vapor deposition (PVD) process the liner material may be formed to selectively alter the adhesion of copper deposited atop the liner material and thus change the mobility of copper flowed over the liner material such as by altering the purity and/or thickness of the liner atop a substrate or substrate field. By adjusting the mobility of copper flowed, or re-flowed atop a cobalt liner formed by a PVD process of the present disclosure, the copper plug within the feature may be improved. The inventive methods may be utilized with any device nodes but may be particularly advantageous in device nodes of about 25 nanometers (nm) or less, for example about 3 nm to about 25 nm, such as 20 nm, 14 nm, 7 nm, 5 nm, or 3 nm.

FIG. 1 depicts a flow chart of a method 100 for filling a feature with copper in accordance with some embodiments of the present disclosure. The method 100 is described below with respect to an interconnect structure, as depicted in FIGS. 2A-2E. The method 100 may be performed in any suitable process chambers configured for one or more of chemical vapor deposition (CVD), physical vapor deposition (PVD), or atomic layer deposition (ALD). Exemplary processing systems suitable for use to perform the inventive methods disclosed herein may include, but are not limited to, any of the ENDURA®, CENTURA®, or PRODUCER® line of processing systems, and the ALPS® Plus or SIP ENCORE® PVD process chambers, all commercially available from Applied Materials, Inc., of Santa Clara, Calif. In embodiments, a PVD process chamber such as an ENCORE® PVD process chamber may be configured to include one or more cobalt targets and one or more cobalt coils configured to deposit cobalt in a PVD chamber atop a substrate including a field and one or more features. Other process chambers, including ones available from other manufacturers, may also be suitably used in connection with the teachings provided herein. In some embodiments, depositing a first cobalt layer via a physical vapor deposition (PVD) process may be performed in a deposition (PVD) processing system such as process chamber 300 as depicted in FIG. 3. Examples of other PVD chambers suitable for performing the PVD cobalt deposition of method 100 described herein include the CIRRUS™ and AVENIR® PVD processing chambers, both commercially available from Applied Materials, Inc., of Santa Clara, Calif. In embodiments, the PVD chamber may include a magnetron.

In some embodiments, the method 100 may begin by providing a substrate to a PVD process chamber, for example the process chamber 300 shown in FIG. 3. The process chamber 300 depicted in FIG. 3 includes a substrate support pedestal 302 for receiving a substrate 304 thereon, and a sputtering source, such as a target 306. The substrate support pedestal 302 may be located within a grounded chamber wall 308, which may be a chamber wall (as shown) or a grounded shield such as a ground shield 340 covering at least some portions of the process chamber 300 above the target 306. In some embodiments, the ground shield 340 could be extended below the target to enclose the substrate support pedestal 302.

As described below with respect to FIG. 3, the process chamber 300 further comprises an RF power source 318 to provide RF energy to the target 306 including source material such a cobalt source material. In some embodiments, the process chamber includes a feed structure for coupling RF and pulsed-DC energy to the target 306. The feed structure is an apparatus for coupling RF and pulsed-DC energy to the target, or to an assembly containing the target, for example, as described herein. A first end of the feed structure can be coupled to an RF power source 318 and a pulsed-DC power source 320, which can be respectively utilized to provide RF and pulsed-DC energy to the target 306. For example, the DC power source 320 may be utilized to apply a negative voltage, or bias, to the target 306. In some embodiments, RF energy supplied by the RF power source 318 may be suitable to provide frequency as described above, or range in frequency. In some embodiments, about 0.25 to about 6 kilowatts of RF energy may be provided to the target at a frequency of from about 13 to about 60 MHz, or 27 to about 40 MHz, or about 40 MHz. In embodiments, about 0.5 to 15.0 kilowatts of DC power is provided to the cobalt or cobalt containing target. In some embodiments, a plurality of RF power sources may be provided (i.e., two or more) to provide RF energy in a plurality of the above frequencies. The feed structure may be fabricated from suitable conductive materials to conduct the RF and pulsed-DC energy from the RF power source 318 and the pulsed-DC power source 320.

In some embodiments, the target 306 is configured as is known in the art and may include one or more cobalt targets or cobalt source materials as described herein. One exemplary PVD processing system suitable for modification in accordance with the teachings herein and for performing the above process is the ENDURA® Cirrus™ HTX PVD system, commercially available from Applied Materials, Inc., of Santa Clara, Calif. In embodiments, suitable PVD chambers include chambers described in U.S. Pat. No. 8,795,487, issued Aug. 5, 2014 to Ritchie, et al., and U.S. Patent Publication Number 2002/0144889, published Oct. 10, 2002 to Rong Tao, et al. In embodiments, suitable PVD chambers include chambers described in U.S. Patent Publication No. 2018/0294162, published on Oct. 11, 2018 and filed on Apr. 7, 2017 to Xie, et al. In embodiments, one or more cobalt targets and one or more cobalt coils are positioned above or adjacent to a substrate in a PVD chamber, and the one or more cobalt targets and one or more cobalt coils are configured to deposit cobalt in a layer atop a substrate as described herein.

In some embodiments, the process chamber includes an RF power source 398 configured to provide RF energy to coil 399 and/or pulsed-DC energy from DC power source 397 to the coil 399. For example, the DC power source 397 may be utilized to apply a negative voltage, or bias, to the coil 399. In some embodiments, RF energy supplied by the RF power source 398 may be suitable to provide frequency as described above, or range in frequency. In some embodiments, about 0.25 to about 6 kilowatts of RF energy may be provided to the coil at a frequency of from about 13 to about 60 MHz, or 27 to about 40 MHz, or about 40 MHz. In embodiments, about 0.5 to 15.0 kilowatts of DC power is provided to the cobalt or cobalt containing coil such as coil 399. In some embodiments, a plurality of RF power sources may be provided (i.e., two or more) to provide RF energy in a plurality of the above frequencies. In embodiments, a feed structure may be fabricated from suitable conductive materials to conduct the RF and pulsed-DC energy from the RF power source 398 and the pulsed-DC power source 397. In some embodiments, the coil 399 is configured to include one or more cobalt coil or cobalt source materials as described herein.

Figure 2A:
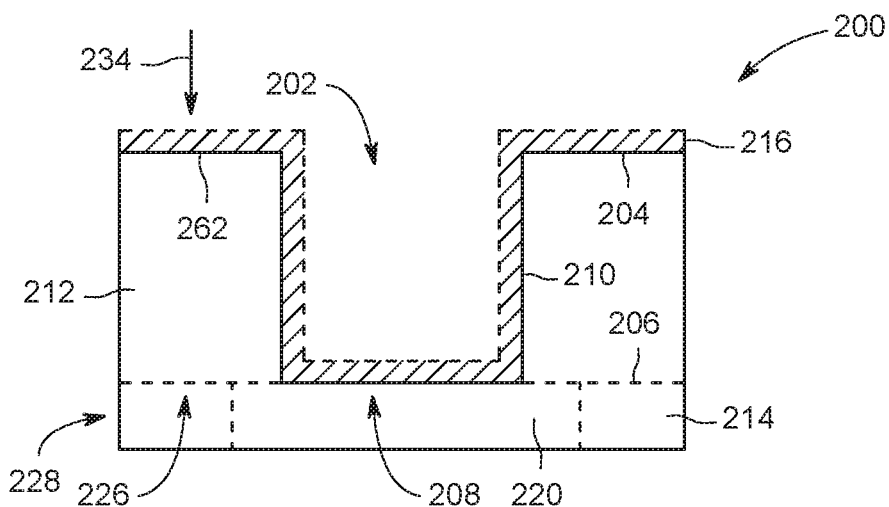
FIGS. 2A-E depict the stages of filling a feature in a substrate in accordance with some embodiments of the present disclosure.
Figure 3:
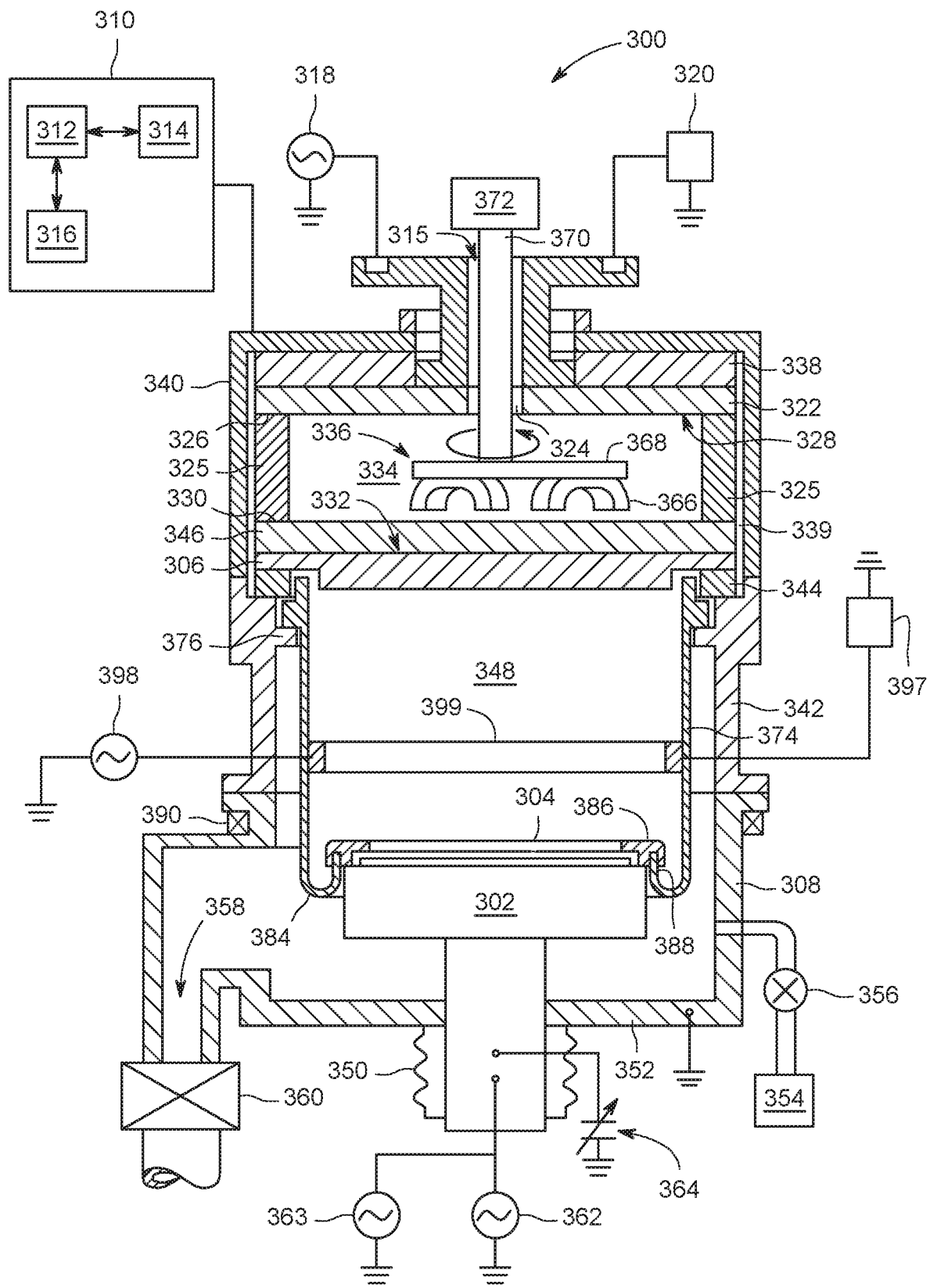
FIG. 3 depicts a schematic cross-sectional side view of a process chamber in accordance with some embodiments of the present disclosure.

FIG. 2A depicts a substrate 200 having an opening 202 formed in a first surface 204 of the substrate 200 and extending into the substrate 200 towards an opposing second surface 206 of the substrate 200. The substrate 200 may be any suitable substrate having an opening 202 formed in the substrate. For example, the substrate 200 may include one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 212, such as silicon oxide, a low-k material (e.g., a material having a dielectric constant less than silicon oxide, or less than about 3.9), or the like. The opening 202 may be formed in the first dielectric layer 212. In some embodiments, the first dielectric layer 212 may be disposed atop a second dielectric layer 214, such as silicon oxide, silicon nitride, silicon carbide, or the like. A first conductive material (e.g., conductive material 220) may be disposed in the second dielectric layer 214 and may be aligned with the opening 202 so the opening, when filled with a second conductive material such as copper, provides an electrical path to and from the first conductive material.

The opening 202 may be any opening, such as a trench, via, dual damascene structure, or the like. In some embodiments, the opening 202 may have a height to width aspect ratio of about 4:1 or more such as 4:1 to 9:1, or 4:1 to 20:1 (e.g., a high aspect ratio). In some embodiments, opening 202 is a trench hole or via hole having a diameter of 25 nm or less, for example about 3 nm to about 25 nm, such as 20 nm, 14 nm, 7 nm, 5 nm, or 3 nm. The opening 202 may be formed by etching the substrate 200 using any suitable etch process. The opening 202 includes a bottom surface 208 and sidewall 210.

In some embodiments, the substrate 200 may optionally be covered with one or more layers prior to depositing a liner such as a cobalt liner formed by a PVD process in accordance with the present disclosure or copper fill material as described below. For example, the sidewall(s) 210 of the opening 202, the bottom surface 208 of the opening, and the first surface 204 of the substrate 200 may be covered by a barrier layer 216 (shown in phantom). The barrier layer 216 may serve to prevent diffusion of a subsequently deposited metal layer into underlying layers, such as first dielectric layer 212. The barrier layer 216 may include any material suitable to act as a barrier. For example, in some embodiments, the barrier layer 216 may include a metal, for example, titanium (Ti), tantalum (Ta), cobalt (Co) such as CVD deposited cobalt), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The barrier layer 216 may have any thickness suitable to prevent the diffusion of subsequently deposited metal layer materials into underlying layers. For example, in some embodiments, the barrier layer 216 layer may have a thickness of about 10 to about 50 angstroms. The barrier layer 216 may be formed by any process suitable to provide the barrier layer 216 having a suitable thickness. For example, in some embodiments, the barrier layer 216 may be formed via a deposition process, such as chemical vapor deposition, physical vapor deposition, or a cyclical deposition process, for example, such as atomic layer deposition, or the like. In embodiments, the barrier layer 216 comprises one of more layers of cobalt deposited by a chemical vapor deposition (CVD) process. In embodiments, a CVD process may deposit cobalt to form barrier layer 216, or one or more layers of barrier layer 216 to a thickness sufficient to function as a barrier layer. In some embodiments, barrier layer 216 comprises one or more CVD cobalt layers having a total thickness in an amount of 10 to 15 angstroms. In embodiments, barrier layer 216 comprises a layer of material conformally deposited atop the substrate as described above, and a second layer of cobalt deposited by a CVD process directly atop the first layer in an amount sufficient to be conformally deposited.

In some embodiments, and as illustrated by dotted lines in FIG. 2A, the opening 202 may extend completely through the substrate 200 and an upper surface 226 of a second substrate 228 and may form the bottom surface 208 of the opening 202. The second substrate 228 may be disposed adjacent to the second surface 206 of the substrate 200. Further (and also illustrated by dotted lines), a first conductive material (e.g., conductive material 220), for example as part of a device, such as a logic device or the like, or an electrical path to a device requiring electrical connectivity, such as a gate, a contact pad, a conductive line or via, or the like, may be disposed in the upper surface 226 of the second substrate 228 and aligned with the opening 202. In some embodiments, the first conductive material (e.g., 220) aligned with the opening 202 may include copper.

Figure 2B:
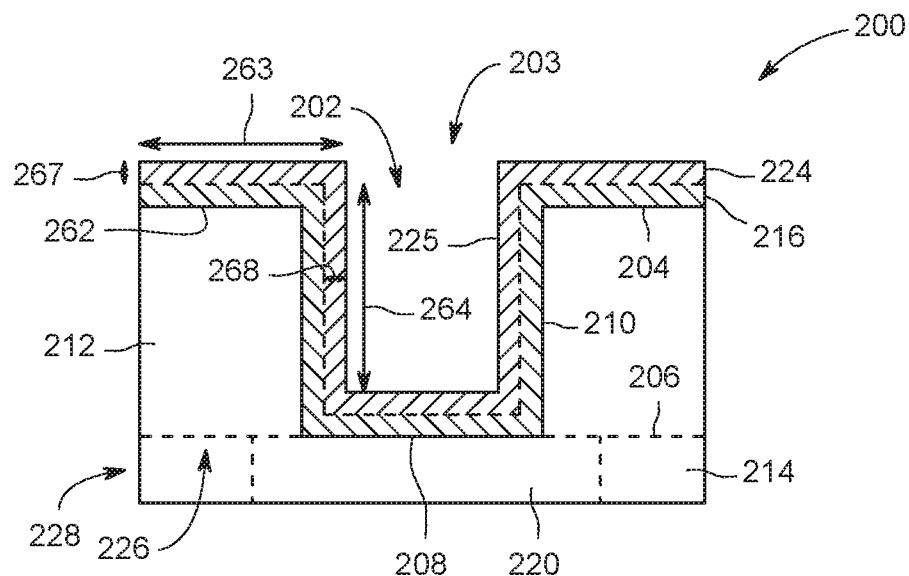

Referring now to FIG. 2B, in some embodiments, the substrate 200 may include a first cobalt layer 224 disposed atop the substrate 200, such as first dielectric layer 212, or optionally atop barrier layer 216. In embodiments, the first cobalt layer 224 may be formed by a PVD process performed in a PVD chamber such as process chamber 300 in FIG. 3 to provide a liner having a predetermined thickness or varied thickness over the length of the first cobalt layer 224 as described below. In embodiments, first cobalt layer 224 is deposited via a physical vapor deposition (PVD) process atop a substrate field 262 and atop a sidewall 210 and a bottom surface 208 of a feature disposed in a substrate 200 to form a first cobalt portion (as shown by arrow 263) atop the substrate field 262 and a second cobalt portion (as shown by arrow 264) atop the sidewall 210. In some embodiments, as shown in FIG. 2B, barrier layer 216 may optionally be disposed between the first cobalt layer 224 and substrate 200. Accordingly, in some embodiments, first cobalt portion (as shown by arrow 263) may not be directly atop the substrate field 262 and second cobalt portion (as shown by arrow 264) may not be directly atop the sidewall 210. In some embodiments, barrier layer 216 may include cobalt material deposited by a chemical vapor deposition (CVD) method. In some embodiments, the barrier layer 216 is CVD cobalt deposited to a thickness of about 10 to 100 angstroms.

In some embodiments, the first cobalt layer 224 may be formed via a PVD deposition process to deposit cobalt having predetermined thicknesses as described herein. In embodiments, the first cobalt portion (portion below arrow 263 in FIG. 2B) of the first cobalt layer 224 may have a first thickness and the second cobalt portion (portion adjacent arrow 264 in FIG. 2B) of the first cobalt layer 224 may have a second thickness, for example thinner than the first thickness. In some embodiments, the first cobalt portion of the first cobalt layer 224 may have a thickness in the amount of about 30 to about 60 angstroms, such as 30 angstroms, 35 angstroms, 40 angstroms, 50 angstroms and the like. In some embodiments, the second cobalt portion atop the sidewall of the first cobalt layer 224 may have a second thickness in the amount of about 10 to about 25 angstroms such as 10 angstroms, 15 angstroms, 20 angstroms and the like. In embodiments, the thickness of the first cobalt portion of the first cobalt layer 224 may be shown as arrow 267, and the thickness of the second cobalt portion of the first cobalt layer 224 may be shown as arrow 268. In embodiments, the thickness of the second cobalt portion (disposed upon the sidewall of a feature) is about 10% to 60% thinner (such as 10%, 20%, 30%, 40% and the like thinner) than the first cobalt portion disposed upon the field of the substrate as represented by portion of the liner below arrow 263.

In some embodiments, first cobalt layer 224 is a liner disposed directly atop first surface 204 of the substrate 200 and on the sidewalls 210 and the bottom surface 208 of the opening 202. In some embodiments, the substrate 200 may be heated prior to depositing the first cobalt layer 224. In some embodiments, the first cobalt layer 224 is deposited to a thickness of about 10 to 100 angstroms. In some embodiments, the first cobalt layer 224 is conformally deposited to cover the sidewalls and bottom surface of the feature such as a trench or via, without filling the feature.

In embodiments, method 100 includes at process sequence 110 depositing a first cobalt layer 224 via a physical vapor deposition (PVD) process atop a substrate field 262 and atop a sidewall 210 and a bottom surface 208 of a feature disposed in a substrate 200 to form a first cobalt portion (below arrow 263) atop the substrate field 262 and a second cobalt portion (adjacent arrow 264) atop the sidewall 210. In some embodiments, the thickness of the first cobalt layer 224 is predetermined. In embodiments, the shape of the first cobalt layer 224 is substantially uniform and conformal as generally shown in FIGS. 2A-2E, however variation may occur such as increased thickness in the first cobalt portion compared to the second cobalt portion. In embodiments, thicker portions of first cobalt layer 224 will reduce the ability of copper deposited thereon to flow over the thicker portion when compared to thinner portions of first cobalt layer 224. In embodiments, thinner portions of first cobalt layer 224 will increase the ability of copper deposited thereon to flow over the thinner portion when compared to thicker portions of first cobalt layer 224. In some embodiments, by varying the thickness of the first cobalt layer 224 the re-flow of copper thereover will be changed. In some embodiments, purer portions of first cobalt layer 224 will decrease the ability of copper deposited thereon to flow over the purer portion when compared to less pure, doped, or adulterated portions of first cobalt layer 224, such as when a cobalt portion is mixed with 1% to 10% carbon.

In some embodiments, as shown in FIG. 2B, substrate field 262 and sidewall 210 of feature 203 are covered with cobalt or cobalt-containing material. In embodiments, the cobalt or cobalt-containing material covering may be formed by performing a plasma process in a physical vapor deposition (PVD) chamber to sputter cobalt atoms from a target onto the substrate field 262 and into the feature 203 and upon the sidewall 210 by performing a plasma process in a physical vapor deposition (PVD) chamber, which can be any PVD chamber configured to deposit cobalt and cobalt-containing material in the manner as disclosed herein. To perform the deposition process of the first cobalt layer 224, RF and/or DC power is provided to a cobalt or cobalt containing target such as target 306 and/or coil such as coil 399 disposed within a PVD process chamber. In some embodiments, about 0.25 to about 6 kilowatts of RF energy may be provided to the target and/or coil at a frequency of from about 13 to about 60 MHz, or 27 to about 40 MHz, or about 40 MHz. In embodiments, about 0.5 to 15.0 kilowatts of DC power is provided to the cobalt or cobalt containing target and/or coil. In some embodiments, a PVD chamber suitable for use herein is configured to provide DC power to the target. In some embodiments, a PVD chamber suitable for use herein is configured to provide DC power to the target and the coil. In some embodiments, a PVD chamber suitable for use herein is configured to provide DC power and RF to one or more coils such as coil 399. In some embodiments, a PVD chamber suitable for use herein is configured to provide DC power to one or more targets and to provide DC power and RF to one or more coils. In embodiments, a PVD chamber suitable for use herein is configured to provide RF and DC power from the substrate support pedestal 302 below the substrate. In embodiments, a PVD chamber suitable for use herein is configured to deliver RF from the pedestal. In embodiments, a PVD chamber suitable for use herein is configured to deliver RF to the one or more coils. In embodiments, suitable amounts of RF applied to the coil includes 1-5 MHz, such as 2 MHz.

In addition, the PVD process chamber 300 as shown in FIG. 3 is maintained at a pressure of about 1 mTorr to about 150 mTorr, or about 10 mTorr to about 150 mTorr. About 10 W to 3000 W, for example at least about 300 W, of RF bias power may be provided to the substrate support at a frequency of about 5 to about 30 MHz, or about 10 to about 15 MHz, or about 13.56 MHz.

In embodiments, the PVD process includes suitable gases to facilitate sputtering. A gas source may provide a suitable gas species such as an inert gas, such as argon, krypton, neon, or the like, hydrogen ($H_2$), or combinations thereof. In some embodiments, the plasma process includes a plasma formed from hydrogen or an inert gas. In some embodiments, only $H_2$ gas is provided.

Still referring to a process to form the first cobalt layer 224, the plasma processing chamber may include a high temperature heater, suitable for heating the substrate to a temperature of about 150° C. to about 500° C. or about 200° C. to about 350° C.

In some embodiments, cobalt target atoms strike the substrate 200 to form first cobalt layer 224. A deposition rate in an amount of 0.1-10 angstroms/sec is suitable for use in accordance with the present disclosure. Accordingly, the physical vapor deposition chamber may be configured to apply a cobalt deposition rate in an amount of 0.1-10 angstroms/sec. In some embodiments, a high density PVD cobalt application reduces impurity, and promotes cobalt grain growth while depositing first cobalt layer 224.

In some embodiments, a PVD treatment may be performed wherein the first cobalt layer 224 has varying thickness and/or purity in an amount sufficient to change the adhesion of copper deposited thereon. Alternatively, the PVD treatment may be performed wherein the first cobalt layer 224 has varying thickness and/or purity in an amount sufficient to change the mobility of copper deposited thereon when flowed over the first cobalt portion compared to the second cobalt portion. In embodiments, the first cobalt portion of first cobalt layer 224 may be substantially pure (such as 99.99% pure) or pure cobalt, where the second cobalt portion atop the sidewall of a feature is doped or adulterated to include 0.1% to 10% carbon by weight of the total second cobalt portion. For example, the addition of carbon to a cobalt portion may increase the flow rate of copper flowed there over or lower the adhesion of copper thereto. In embodiments, the flow rate of copper may be 5% to 50%, such as about 10%, 20%, or 30% faster over the second cobalt portion of the present disclosure compared to the first cobalt portion of the present disclosure.

Figure 2C:
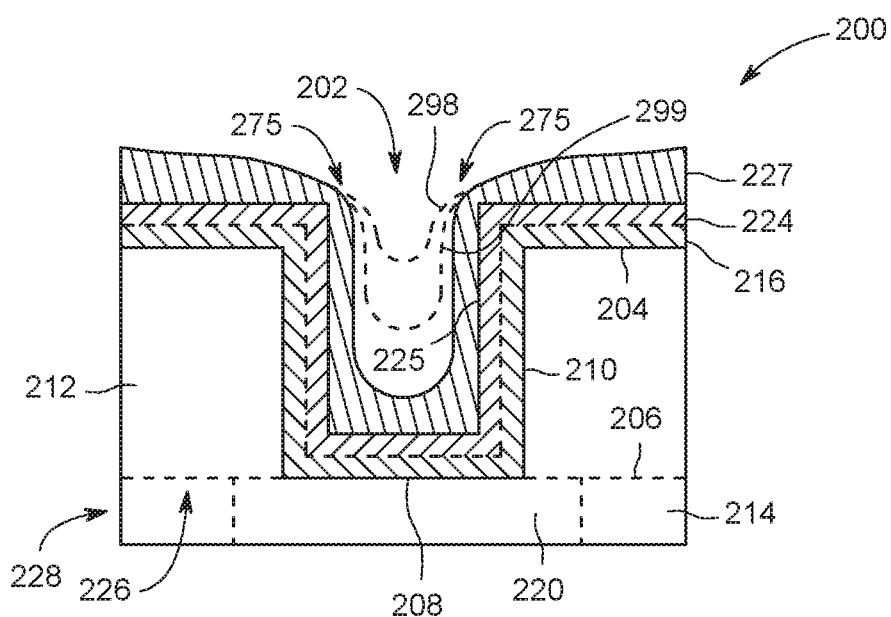

Referring back to FIG. 1 at 120, and FIG. 2C, embodiments of the present disclosure include depositing copper 227 atop the first cobalt layer 224. In embodiments, copper is deposited atop the first cobalt layer 224 including the first cobalt portion atop the substrate 200. In embodiments, copper 227 is deposited in a layer directly atop the first cobalt portion and second cobalt portion. In some embodiments the copper is deposited within the feature. In some embodiments, copper is deposited in an amount of 50 to 150 angstroms, which may be cyclically repeated.

Figure 2D:
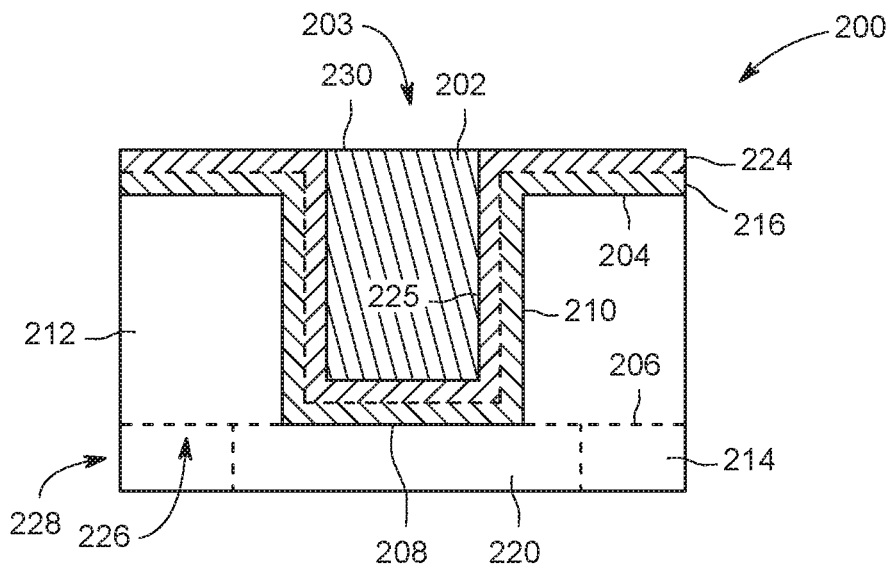

Referring to FIG. 1 at 130 and FIG. 2C, embodiments of the present disclosure include flowing the copper 227 disposed atop the first cobalt portion (below arrow 263 in FIG. 2B) atop the substrate over the second cobalt portion (adjacent arrow 264) and into the feature 203, wherein the first cobalt portion (below arrow 263) atop the substrate reduces the mobility of copper compared to the mobility of copper over the second cobalt portion (adjacent arrow 264). As shown in FIG. 2C, the copper thins near corners 275 as the copper adheres more to the first cobalt portion (below arrow 263 in FIG. 2B) atop the substrate than to the second cobalt portion within the features or on the sidewall of the feature. In embodiments, the copper is pinned near corners 275 as the copper adheres more to the first cobalt portion (below arrow 263 in FIG. 2B) atop the substrate than to the second cobalt portion within the features or on the sidewall of the feature. In embodiments, the copper 227 is heated to a temperature greater than 150 degrees Celsius to flow copper from the first cobalt portion over the second cobalt portion. As there is more copper mobility of the second cobalt portion, void formation and overhangs are avoided. In embodiments a second conductive material 230 such as copper may be deposited within the feature by way of cyclical copper deposit on and reflow from the first cobalt portion over the second cobalt portion. In some embodiments, a copper deposited atop the first cobalt portion may be heated, or annealed, to draw the deposited copper material into the opening 202 (for example, via capillary action). The heating process may be performed at a temperature ranging from about 150 to about 400 degrees Celsius. In some embodiments, the first cobalt layer 224 allows for the second conductive material 230 or copper 227 to re-flow into, and fill, the opening without forming a void in the opening. Upon completion of the heating process, the bottom surface 208 of the opening 202 may be covered with deposited material. In some embodiments, the process of reflowing conductive material such as copper or depositing the second conductive material 230 of a conductive layer and annealing the deposited second conductive material may be repeated to fill the opening 202 as shown by the two phantom lines 298 and 299 (representing different partially filled feature levels within the feature with conduct material such as copper) within the feature as shown in FIG. 2C and in FIG. 2D showing the feature filled completely with conductive material 230 such as copper. In some embodiments, techniques, such as wet clean in an acidic solution, chemical or electrochemical mechanical polishing, or the like may be used to remove excess deposited material from the upper surface above opening 202.

Figure 2E:
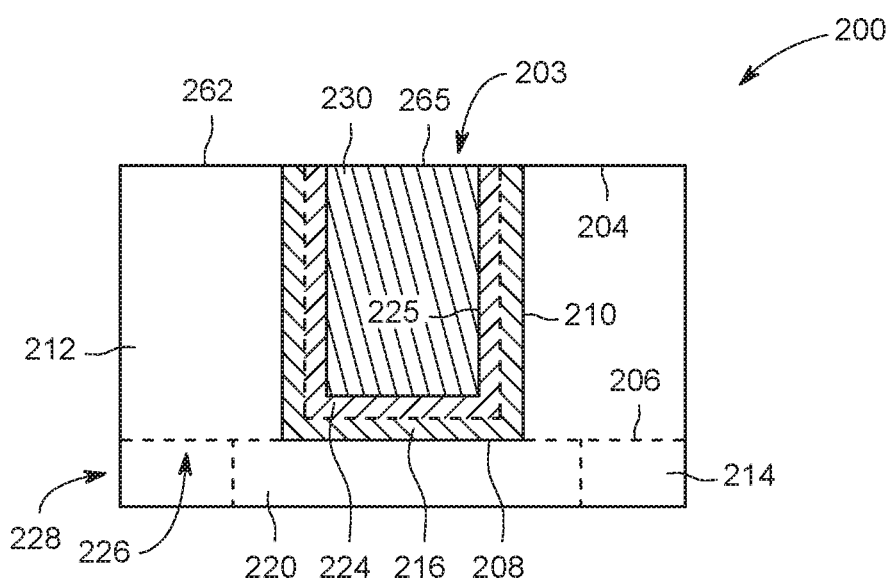

In embodiments, as depicted in FIG. 2E, following formation of a copper filled feature, the device may be subjected to polishing and planarization to remove layers deposited atop first surface 204. For example, a chemical mechanical planarization (CMP) method may be used to form a structure as shown in FIG. 2E with an exposed metal surface such as metal surface 265 which is, in embodiments, a top surface of a feature plug within a low-k dielectric layer including exposed dielectric layer field such as substrate field 262 comprised or consisting of a low-k material. In embodiments, metal surface 265 is equivalent to substrate field 262, for example, metal surface 265 and substrate field 262 form a continuous layer or continuous top surface of substrate 200.

Referring back to FIG. 3, a PVD chamber such as, for example, a PVD chamber (e.g., process chamber 300) suitable for use herein includes target 306 and coil 399 as described above. In some embodiments, the process chamber 300 includes a feed structure for coupling RF and pulsed-DC energy to the target 306. The feed structure is an apparatus for coupling RF and pulsed-DC energy to the target, or to an assembly containing the target, for example, as described herein. A first end of the feed structure can be coupled to an RF power source 318 and a pulsed-DC power source 320, which can be respectively utilized to provide RF and pulsed-DC energy to the target 306. For example, the DC power source 320 may be utilized to apply a negative voltage, or bias, to the target 306. In some embodiments, RF energy supplied by the RF power source 318 may be suitable to provide frequency as described above.

In some embodiments, the feed structure may have a suitable length to facilitate substantially uniform distribution of the respective RF and pulsed-DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and pulsed-DC energy from the feed structure.

The source distribution plate 322 may be coupled to the target 306 via a conductive member 325. The conductive member 325 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the source distribution plate 322, the conductive member 325, and the target 306 (and/or backing plate 346) to prevent the RF and pulsed-DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between an RF feed and the body, thus improving plasma, and processing, uniformity.

An isolator plate 338 may be disposed between the source distribution plate 322 and the ground shield 340 to prevent the RF and pulsed-DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter such as 342 through a dielectric isolator 344. The target 306 comprises a material to be deposited on the substrate 304 during sputtering, such a cobalt or cobalt containing material. In some embodiments, the backing plate 346 may be coupled to the source distribution plate-facing surface 332 of the target 306. The backing plate 346 may comprise a conductive material, such as cobalt, or the same material as the target, so RF and pulsed-DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the process chamber 300 and thereafter raised to a deposition, or processing position. One or more processing gases may be supplied from a gas source 354 through a mass flow controller 356 into the lower part of the process chamber 300. An exhaust port 358 may be provided and coupled to a pump (not shown) via a valve 360 for exhausting the interior of the process chamber 300 and facilitating maintaining a desired pressure inside the process chamber 300.

In embodiments, an RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. Further, a second RF bias power source may be coupled to the substrate support pedestal 302 and provide any of the frequencies discussed above for use with the RF bias power source 362. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired.

In some embodiments, the PVD processing chamber includes one or more coils 399 as shown in FIG. 3. In embodiments, the one or more coils 399 comprise pure or substantially pure cobalt. In embodiments, the PVD processing chamber is configured to supply RF to the one or more coils 399. In embodiments, RF may be applied to the one or more coil 399 in an amount sufficient to provide a cobalt layer atop the substrate and within the features of the substrate. In embodiments, the PVD chamber has dual material sources (a target and a coil) (first and second sources) configured to provide cobalt to the substrate as described herein. In some embodiments, coil 399 is an inductive coil may be positioned nearer to the substrate support than the target. The coil 399 may be formed from a material similar or equal in composition to the target, such as for example, cobalt, to act as a secondary sputtering target. In embodiments, a power source applies current to the coil to induce an RF field within the process chamber and couple power to the plasma to increase plasma density, i.e. concentration of reactive ions.

In embodiments, an RF bias power source 398 may be coupled to the coil 399 in order to induce a negative DC bias on the coil 399. In addition, in some embodiments, a negative DC self-bias may form on the coil 399 during processing. For example, RF power supplied by the RF bias power source 398 may range in frequency from about 2 MHz to about 60 MHz, for example, non-limiting frequencies such as 2 MHz, 13.56 MHz, or 60 MHz can be used.

In some embodiments, a rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the process chamber 300 and the substrate 304. A motor 372 can be coupled to the upper end of the rotation shaft 370 to drive rotation of the magnetron assembly 336. The magnets 366 produce a magnetic field within the process chamber 300, generally parallel and close to the surface of the target 306 to trap electrons and increase the local plasma density, which in turn increases the sputtering rate. The magnets 366 produce an electromagnetic field around the top of the process chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the process chamber 300 may further include a process kit shield 374 connected to a ledge 376 of the adapter 342. The adapter 342 in turn is sealed and grounded to the aluminum chamber sidewall such as chamber wall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottom portion of the process kit shield may have any suitable shape. A cover ring 386 rests on the top of an upwardly extending lip 388 of the process kit shield 374 when the substrate support pedestal 302 is in a lower, loading position but rests on the outer periphery of the substrate support pedestal 302 when the substrate support pedestal 302 is in an upper, deposition position to protect the substrate support pedestal 302 from sputter deposition. An additional deposition ring (not shown) may be used to shield the periphery of the substrate 304 from deposition. Embodiments of a process kit shield are discussed below in accordance with the present disclosure.

In some embodiments, a magnet 390 may be disposed about the process chamber 300 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor configured for use in an industrial setting for controlling various chambers and sub-processors. The memory 314, or computer readable medium of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. The support circuits 316 include cache, power supplies, clock circuits, input/output circuitry and subsystems, and the like. Inventive methods as described herein may be stored in the memory 314 as software routine executed or invoked to control the operation of the process chamber 300 in the manner described herein. The software routine may also be stored and/or executed by a second CPU (not shown) remotely located from the hardware being controlled by the CPU 312.

In some embodiments, the present disclosure relates to a physical vapor deposition chamber configured for forming a cobalt material on a substrate. For example, in embodiments, a physical vapor deposition chamber is configured for (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall.

In some embodiments, the present disclosure relates to a physical vapor deposition chamber configured for forming an interconnection on a substrate. For example, in embodiments, a physical vapor deposition chamber is configured for (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall.

Referring back to FIG. 1, method 100, in some embodiments, the present disclosure relates to a method of filling a feature with copper, including: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces the mobility of copper compared to the mobility of copper over the second cobalt portion. In some embodiments, the first cobalt portion is thicker than the second cobalt portion. In some embodiments, the first cobalt portion has a thickness of 30 to 60 angstroms, and the second cobalt portion has a thickness of 15 to 30 angstroms. In some embodiments, the feature is a trench or high-aspect ratio via. In some embodiments, the feature is partially filled with copper. In some embodiments, flowing the copper further comprises heating the copper to a temperature of at least 350 degrees Celsius. In some embodiments, a barrier layer is optionally disposed between the first cobalt layer and the substrate. In some embodiments, (b) and (c) are repeated to deposit copper in an amount sufficient to fill the feature from the bottom surface to a top corner.

Figure 4:
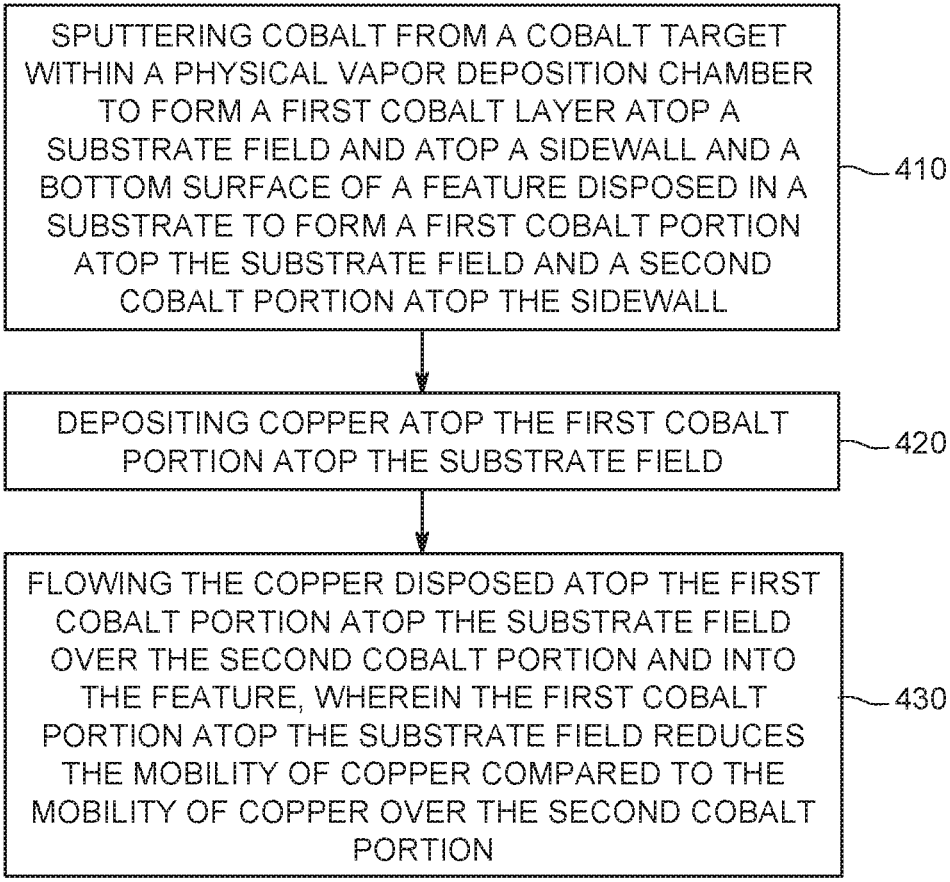
FIG. 4 is a flowchart illustrating a method of filling a feature with copper in accordance with some embodiments of the present disclosure.

Referring now to FIG. 4, embodiments of the present disclosure include a method 400 of filling a copper feature on a substrate. At process sequence 410, the method includes (a) sputtering cobalt from a cobalt target within a physical vapor deposition chamber to form a first cobalt layer atop a substrate field and atop a sidewall and a bottom surface of a feature disposed in a substrate to form a first cobalt portion atop the substrate field and a second cobalt portion atop the sidewall. At process sequence 420, the method includes (b) depositing copper atop the first cobalt portion atop the substrate field. At process sequence 430, the method may include (c) flowing the copper disposed atop the first cobalt portion atop the substrate field over the second cobalt portion and into the feature, wherein the first cobalt portion atop the substrate field reduces the mobility of copper compared to the mobility of copper over the second cobalt portion, such as the second cobalt portion disposed within the feature. In some embodiments, sputtering cobalt from a cobalt target further includes flowing reactive gases into a physical vapor deposition processing chamber having a cobalt target; applying an electrical bias to the cobalt target to sputter atoms from the cobalt target; and depositing the first cobalt layer including the sputtered atoms on the substrate. In some embodiments, the physical vapor deposition chamber is at a temperature of about 16° C. to 25° C. In some embodiments, the physical vapor deposition processing chamber is at a pressure of about 0.1 to 150 milliTorr. In some embodiments, DC power is applied to the cobalt target in an amount of about 1 to about 500 KW.

Figure 5:
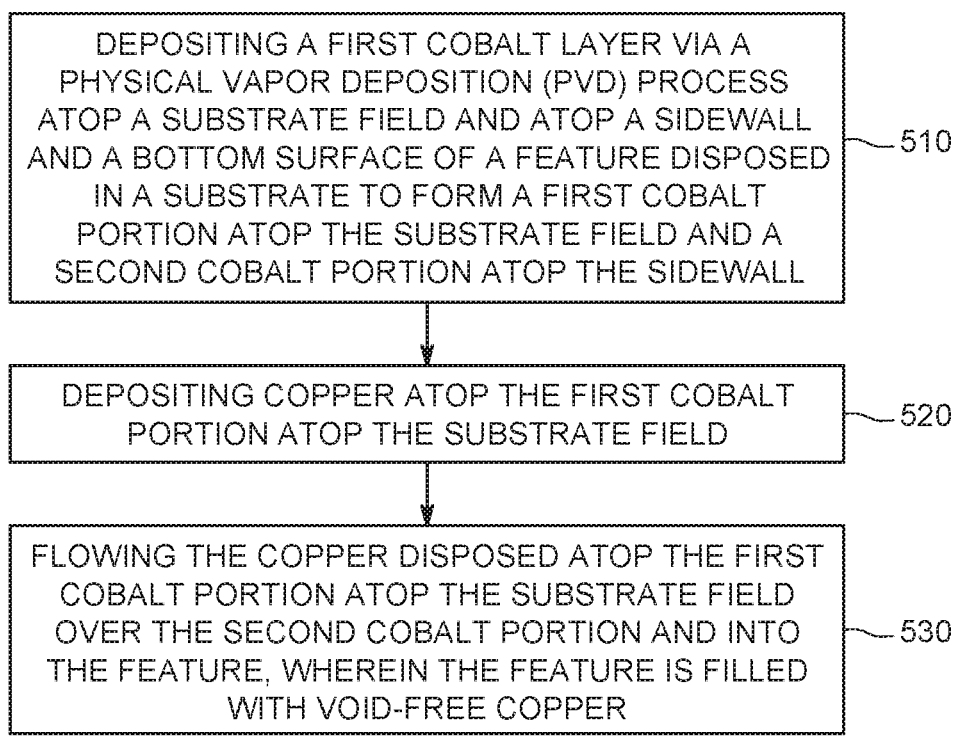
FIG. 5 is a flowchart illustrating a method of filling a feature with copper in accordance with some embodiments of the present disclosure.

Referring now to FIG. 5, embodiments of the present disclosure include a method 500 for filling a feature with copper. At process sequence 510 the method includes (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall or within the feature. At process sequence 520 the method includes depositing copper atop the first cobalt portion atop the substrate field. At process sequence 530, the method includes flowing the copper disposed atop the first cobalt portion atop the substrate field over the second cobalt portion and into the feature, wherein the feature is filled with void-free copper. In some embodiments, the feature is filled with void-free copper from the bottom surface to an opening. In some embodiments, the feature is a high-aspect ratio via. In some embodiments, depositing a first cobalt layer includes sputtering cobalt from a cobalt target disposed in a physical vapor deposition chamber. In some embodiments, the first cobalt portion is thicker than the second cobalt portion, and wherein the first cobalt portion adheres to copper more than the second cobalt portion. In some embodiments, the method 400 further includes depositing a barrier layer within the feature prior to depositing the first cobalt layer and depositing the first cobalt layer directly atop the barrier layer. In some embodiments, the barrier layer comprises titanium nitride or tantalum nitride.

In embodiments, the present disclosure includes a non-transitory computer readable medium having instructions stored thereon, when executed, cause a method for filling a feature, including: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces the mobility of copper compared to the mobility of copper over the second cobalt portion.

In some embodiments, a cobalt layer or cobalt material may be applied by chemical vapor deposition at various times during the process sequence of the process of the present disclosure. For example, in some embodiment, a method for filling a feature with copper, includes: depositing a first cobalt layer via a chemical vapor deposition (CVD) process atop a substrate field and atop a sidewall and a bottom surface of a feature disposed in the substrate. Subsequent to the CVD process sequence, the methods of the present disclosure may include depositing a second PVD cobalt layer via a physical vapor deposition (PVD) process atop a first CVD cobalt layer disposed upon the substrate field and atop a sidewall and a bottom surface of a feature disposed in a substrate to form a PVD cobalt portion atop the substrate field and a PVD cobalt portion atop the sidewall. Next the process may include depositing copper atop the PVD cobalt portion atop the substrate field; and flowing the copper disposed atop the PVD cobalt portion atop the substrate field over the second PVD cobalt portion and into the feature, wherein the first PVD cobalt portion atop the substrate field reduces the mobility of copper compared to the mobility of copper over the second cobalt portion. In some embodiments, the CVD cobalt is deposited before process sequence 110 shown in FIG. 1. In some embodiments, CVD cobalt is deposited after process sequence 110 shown in FIG. 1. In some embodiments, the substrate or workpiece is moved into a process chamber suitable for depositing CVD cobalt. In some embodiments, a cobalt deposition process of the present disclosure may be carried out using a system, such as an Endura® Volta™ CVD cobalt available from Applied Materials, Inc. of Santa Clara, Calif.

In some embodiments, a bulk cobalt material is deposited by a cyclic CVD process. In embodiments, the cyclic CVD process includes repeating cobalt CVD deposition until a predetermined thickness of the bulk cobalt material is achieved. If the predetermined thickness of the bulk cobalt material has not been achieved additional cycles of cobalt CVD deposition is performed. For example, if the total thickness of the bulk cobalt material is 300 angstrom and each portion of the bulk cobalt material is deposited at 50 angstrom/cycle then 6 cycles of (50 angstrom of deposition) will be needed. In some embodiments, a CVD cobalt deposition is performed under conditions described in U.S. Pat. No. 8,524,600 entitled Post Deposition Treatments for CVD Cobalt Films granted on Sep. 3, 2013 and assigned to Applied Materials Inc.

In embodiments, the present disclosure includes a non-transitory computer readable medium having instructions stored thereon, when executed, cause a method for filling a feature, including: (a) sputtering cobalt from a cobalt target within a physical vapor deposition chamber to form a first cobalt layer atop a substrate field and atop a sidewall and a bottom surface of a feature disposed in the substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces the mobility of copper compared to the mobility of copper over the second cobalt portion.

In embodiments, the present disclosure includes a non-transitory computer readable medium having instructions stored thereon, when executed, cause a method for filling a feature with copper, including: (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall; (b) depositing copper atop the first cobalt portion atop the substrate field; and (c) flowing the copper disposed atop the first cobalt portion atop the substrate field over the second cobalt portion and into the feature, wherein the feature is filled with void-free copper.

While the foregoing is directed to embodiments of the present disclosure, other and further embodiments of the disclosure may be devised without departing from the basic scope thereof.

The invention claimed is:

1. A method for filling a feature with copper, comprising:
   (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall, wherein the first cobalt portion has a thickness of 30 to 60 angstroms, and the second cobalt portion has a thickness of 15 to 30 angstroms, and wherein the first cobalt portion is thicker than the second cobalt portion;
   (b) depositing copper atop the first cobalt portion atop the substrate field; and
   (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion.

2. The method for filling a feature with copper of claim 1, wherein the feature is a trench or high-aspect ratio via.

3. The method for filling a feature with copper of claim 1, wherein the feature is partially filled with copper.

4. The method for filling a feature with copper of claim 1, wherein flowing the copper further comprises heating the copper to a temperature of at least 350 degrees Celsius.

5. The method for filling a feature with copper of claim 1, wherein a barrier layer is optionally disposed between the first cobalt layer and the substrate.

6. The method for filling a feature with copper of claim 1, wherein (b) and (c) are repeated to deposit copper in an amount sufficient to fill the feature from the bottom surface to a top corner.

7. A method of filling a copper feature on a substrate, comprising:
   (a) sputtering cobalt from a cobalt target within a physical vapor deposition chamber to form a first cobalt layer atop a substrate field and atop a sidewall and a bottom surface of a feature disposed in a substrate to form a first cobalt portion atop the substrate field and a second cobalt portion atop the sidewall, wherein the first cobalt portion has a thickness of 30 to 60 angstroms, and the second cobalt portion has a thickness of 15 to 30 angstroms, and wherein the first cobalt portion is thicker than the second cobalt portion;
   (b) depositing copper atop the first cobalt portion atop the substrate field; and
   (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion.

8. The method of claim 7, wherein sputtering cobalt from a cobalt target further comprises flowing reactive gases into a physical vapor deposition processing chamber having a cobalt target;
   applying an electrical bias to the cobalt target to sputter atoms from the cobalt target; and
   depositing the first cobalt layer comprising the sputtered atoms on the substrate.

9. The method of claim 7, wherein the physical vapor deposition chamber is at a temperature of about 16° C. to 25° C.

10. The method of claim 7, wherein the physical vapor deposition chamber is at a pressure of about 0.1 to 150 millitorr.

11. The method of claim 6, wherein DC power is applied to the cobalt target in an amount of about 1 to about 500 kW.

12. A non-transitory computer readable medium having instructions stored thereon, when executed, cause a method for filling a feature, comprising:
   (a) depositing a first cobalt layer via a physical vapor deposition (PVD) process atop a substrate field and atop a sidewall and a bottom surface of a feature disposed in a substrate to form a first cobalt portion atop the substrate field and a second cobalt portion atop the sidewall, wherein the first cobalt portion has a thickness of 30 to 60 angstroms, and the second cobalt portion has a thickness of 15 to 30 angstroms, and wherein the first cobalt portion is thicker than the second cobalt portion;

(b) depositing copper atop the first cobalt portion atop the substrate field; and (c) flowing the copper disposed atop the first cobalt portion atop the substrate field over the second cobalt portion and into the feature, wherein the first cobalt portion atop the substrate field reduces a mobility of copper compared to a mobility of copper over the second cobalt portion.

13. The non-transitory computer readable medium of claim 12, wherein the feature is filled with void-free copper from the bottom surface to an opening.

14. The non-transitory computer readable medium of claim 12, wherein the feature is a high-aspect ratio via.

15. The non-transitory computer readable medium of claim 12, wherein depositing a first cobalt layer comprises sputtering cobalt from a cobalt target disposed in a physical vapor deposition chamber.

16. The non-transitory computer readable medium of claim 12, wherein the first cobalt portion is thicker than the second cobalt portion, and wherein the first cobalt portion adheres to copper more than the second cobalt portion.

17. The non-transitory computer readable medium of claim 12, wherein the instructions further comprise, when executed, cause a barrier layer within the feature to be deposited prior to depositing the first cobalt layer, and depositing the first cobalt layer directly atop the barrier layer.

18. The non-transitory computer readable medium of claim 17, wherein the barrier layer comprises titanium nitride or tantalum nitride.

19. The method for filling a feature with copper of claim 1, wherein the first cobalt layer is deposited at a rate of 0.1-10 angstroms/sec.

20. The method for filling a feature with copper of claim 1, wherein the first cobalt portion is substantially pure or pure cobalt and the second cobalt portion is doped or adulterated to include 0.1% to 10% carbon by weight of a total of the second cobalt portion.

* * * * *